(12) United States Patent
Cao

(10) Patent No.: US 6,519,311 B2
(45) Date of Patent: Feb. 11, 2003

(54) OVERFLOW DETECTOR FOR FIFO

(75) Inventor: Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/104,870

(22) Filed: Mar. 21, 2002

(65) Prior Publication Data

US 2002/0099883 A1 Jul. 25, 2002

Related U.S. Application Data

(63) Continuation of application No. 09/772,781, filed on Jan. 29, 2001, now Pat. No. 6,396,894.
(60) Provisional application No. 60/179,593, filed on Feb. 1, 2000.

(51) Int. Cl.[7] .............................................. G06M 3/00
(52) U.S. Cl. .............................. 377/2; 377/26; 377/28; 365/221
(58) Field of Search .............................. 365/221; 377/2, 377/26, 28

(56) References Cited

U.S. PATENT DOCUMENTS 4,873,667 A * 10/1989 Geadah et al. ......... 365/189.07
6,101,329 A * 8/2000 Graef ........................ 395/872

* cited by examiner

*Primary Examiner*—Margaret R. Wambach
(74) *Attorney, Agent, or Firm*—Babak S. Sani; Townsend and Townsend and Crew LLP

(57) ABSTRACT

The present invention provides an overflow detector for a FIFO. The FIFO includes a plurality of registers each having an input and an output, a plurality of write signals each respectively coupled to a clock, one of the plurality of registers, and a plurality of read switches each respectively coupled to an output of one of the plurality of registers, each of the plurality of read switches being controlled by a respective read signal. The overflow detector includes a plurality of clocked registers each of which is coupled to receive a write signal and its corresponding read signal, wherein each clocked register records a read signal and is clocked by the corresponding write signal.

18 Claims, 3 Drawing Sheets

OVERFLOW DETECTOR FOR FIFO

CROSS REFERENCE TO RELATED APPLICATIONS

This application is a continuation of application Ser. No. 09/772,781, filed Jan. 29, 2001 now U.S. Pat. No. 6,396,894 entitled "OVERFLOW DETECTOR FOR FIFO" and claims priority from provisional application No. 60/179,593, filed Feb. 1, 2000, the disclosure of which is incorporated herein by reference.

BACKGROUND OF THE INVENTION

The present invention relates in general to high-speed integrated circuits and more particularly to a method and circuitry for implementing overflow detection structures for high-speed first-in-first-out (FIFO) operations.

FIFOs are used in a variety of circuit applications. For example, a serializer may use a FIFO structure to address different system timing requirements. In such an application, the integrated circuit often employs an internal clock that may not be synchronized with an external clock used to supply data to the integrated circuit. A FIFO is used to transfer the data from the external clock regime to the internal clock regime. Typically, such a FIFO includes a number of registers that operate in response to a write pointer and a read pointer. An external clock controls the write pointer while an internal clock controls the read pointer. A problem arises when the read and write pointers collide, that is, when they attempt to read and write the same FIFO register at about the same time. This condition is commonly referred to as an overflow condition and can result from improper resetting of the FIFO pointers caused by, for example, glitches in the pointer generation circuits, drifting of the external clock phase, etc. During an overflow condition, the data read from the FIFO may be corrupted. FIFOs thus need some type of overflow detection mechanism to detect an overflow condition and avoid this faulty operation.

Conventionally, overflow detection has been implemented using combinatorial logic whereby the read and write pointers into the same FIFO register are gated together to flag an overflow signal. Specifically, the read and write signals are logically ANDed such that when a collision occurs, an overflow detection signal is asserted. These types of overflow detection suffer, however, from possible glitches and thus erroneous flagging of overflow. Data loss occurs when an overflow detector output is used to reset the FIFO and to separate the read and write pointers. While a FIFO register resets, it cannot accept new data. Thus, an erroneous overflow flagging can cause data loss.

There is thus a need for an improved method and circuitry for implementing high-speed FIFO and overflow detection structures.

SUMMARY OF THE INVENTION

The present invention provides method and circuitry for implementing high speed FIFO structures with improved overflow detection mechanism. In one embodiment read pointes are recorded into registers that are clocked by their corresponding write pointers. The outputs of the registers are then logically combined to generate a signal indicating an overflow condition. By making the duty cycle of the write clock signals smaller than the duty cycle of the read signals, proper detection of an overflow condition is guaranteed.

Accordingly, in one embodiment, the present invention provides a FIFO that includes a plurality of registers each having an input and an output, a plurality of write signals each respectively coupled to a clock input of one of the plurality of registers, and a plurality of read switches each respectively coupled to an output of one of the plurality of registers, the plurality of read switches being controlled by a respective plurality of read signals. The FIFO further includes a write pointer circuit that is configured to generate the pluarlity of write signals and a read pointer circuit that is configured to generate the plurality of read signals, wherein, the pluraity of write signals are generated at a frequency that is different than that of the plurality of read signals. In a specific embodiment, the write pointer circuit includes a plurality of flip-flops that are serially coupled in a ring with each flip-flop being alternately clocked by a rising edge and a falling edge of a write clock signal.

In a specific embodiment, outputs of the plurality of clocked registers logically combine at an OR gate. In another embodiment, the write clock duty cycle for the write pointer is smaller than the read clock duty cycle for the read pointer.

In another embodiment, the overflow detector incudes a clock present signal for detecting when the write clock stops toggling. The overflow detector generates an overflow detection signal when the clock present signal is not asserted.

In yet another embodiment, the present invention provides a method for detecting overflow in a FIFO structure that uses read pointers and corresponding write pointers, the method including recording each read pointer into a register clocked by its corresponding write pointer; and logically combining outputs of all registers. The method further reducing a duty cycle of the write pointers compared to the duty cycle of the read pointers.

The following detailed description and the accompanying drawings provide a better understanding of the nature and advantages of the FIFO with the overflow detection according to the present invention.

DESCRIPTION OF THE SPECIFIC EMBODIMENTS

With reference to the drawings, the improved method and circuitry for implementing high-speed FIFO and overflow detection mechanism according to the present invention is described below.

Figure 1:
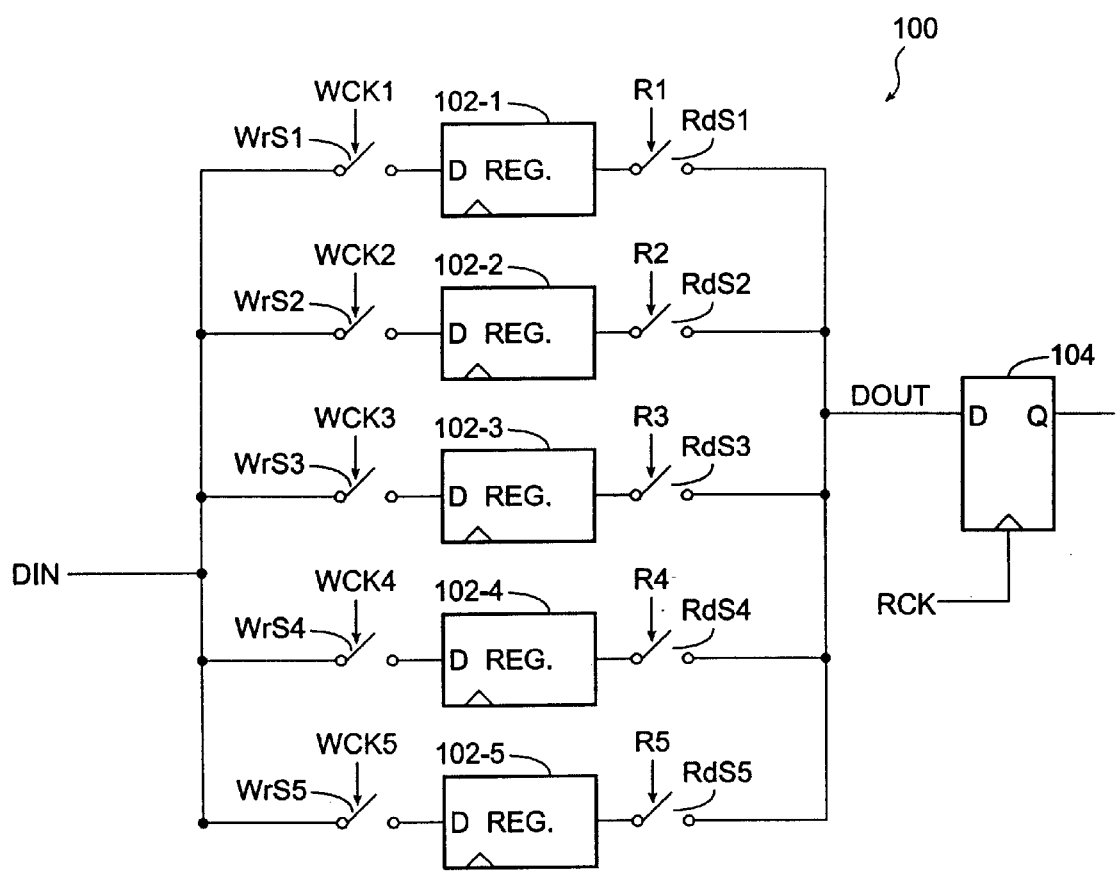
FIG. 1 shows a simplified high-level block diagram of an exemplary five-register-deep FIFO circuit.

FIG. 1 shows a simplified high-level block diagram of an exemplary five-register-deep FIFO circuit 100. FIFO circuit 100 includes a set of five registers 102-1 to 102-5. It is to be understood that the FIFO of the present invention can have as many stages as desired, and that the 5-stage implementation is described herein for illustrative purposes only. Each of the registers 102-1 to 102-5 receives a data input clocked in by respective write clock pointer signals WCk1 to WCk5.

For illustrative purposes, write clock signals WCk1 to WCk5 are shown as controlling pass switches WrS1 to WrS5, respectively. While this shows a logical depiction of the input circuit, write clock signals WCk1 to WCk5 may be directly applied to clock inputs registers 102 that may be implemented using, for example, D-type flip flops. The DIN signal would then directly couple to the D input of each register 102. The terminology "write pointer" and "write clock" are used herein interchangeably. In this embodiment, each register is updated at the falling edge of the corresponding write clock signals (WCk1–5). The outputs of registers 102-1 to 102-5 connect to a data output node DOUT via read switches RdS1 to RdS5, respectively. Read switches RdS1 to RdS5 are controlled by read clock pointer signals R1 to R5, respectively. FIFO circuit 100 also includes a final register 104 that receives DOUT at its input. Register 104 operates to synchronize the timing of the signal on DOUT using the read clock RCk.

In operation, FIFO 100 translates the timing of the input data from an external clock which controls write clock pointer signals WCk1 to WCk5, to the internal read clock RCk. To detect an overflow condition, the present invention uses, in a specific embodiment, a state machine (shown in FIG. 2) to monitor the timing relationship of read pointers and write pointers. The state machine ensures that a momentary overflow condition is detected and minimizes erroneous overflow flagging caused by glitches. In this embodiment, an overflow detection register monitors the relationship between each corresponding pair of the read and write pointers for each FIFO register. It is to be understood that FIFO 100 as shown in FIG. 1 has been simplified for illustrative purposes.

Figure 2:
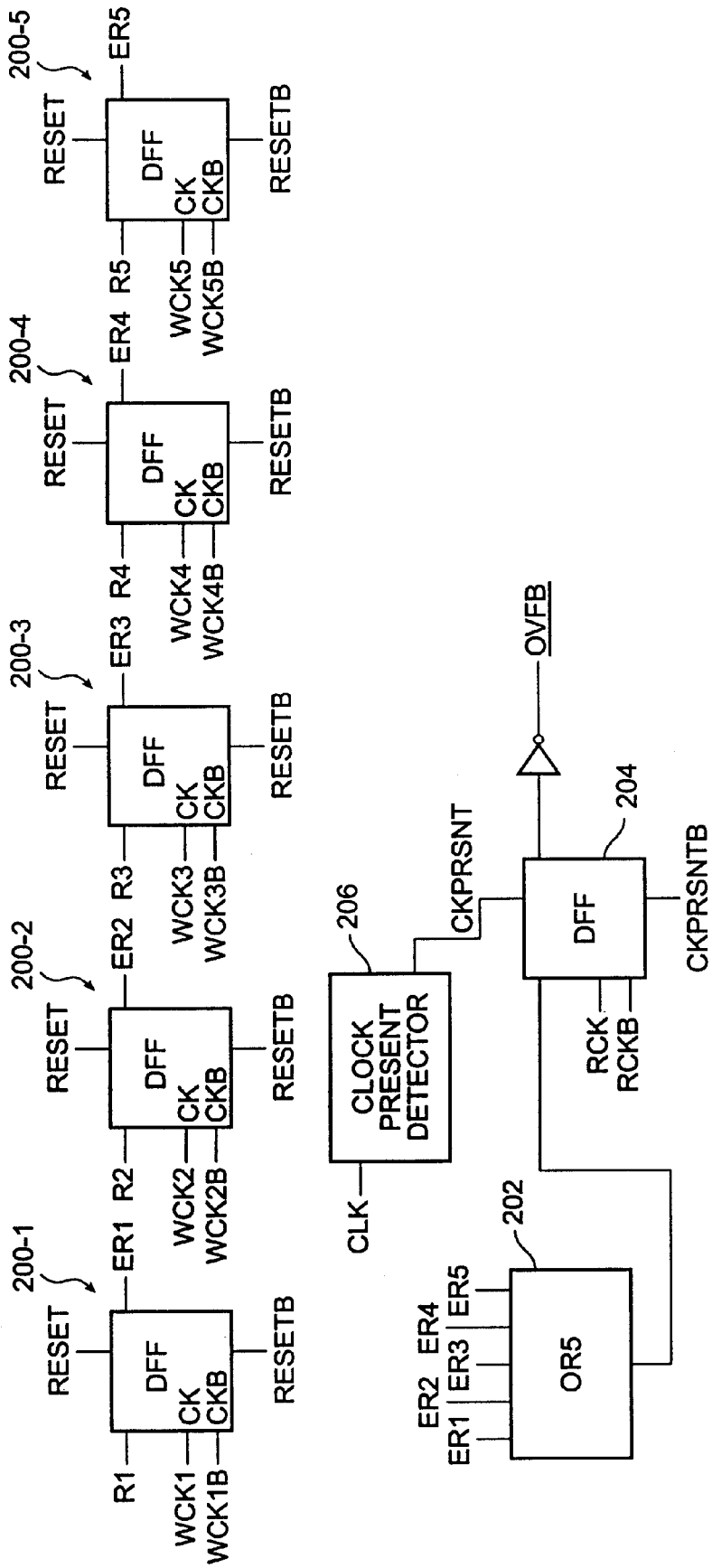
FIG. 2 shows a simplified high-level block diagram of an exemplary five-register overflow detector, according to an embodiment of the present invention.

FIG. 2 shows a simplified high-level block diagram of an overflow detector 200 according to one embodiment of the present invention. Five registers 200-1 to 200-5 monitor the timing relationships between the read and write pointers. In this specific embodiment, the registers are implemented by D-type flip-flops. Each register receives a read pointer (R1 to R5) at its D input and a corresponding write pointer (WCk1 to WCk5) at its clock input. Each one of the outputs ER1 to ER5 of registers 200-1 to 200-5, respectively, signals an overflow condition if one occurs. These outputs are logically combined together, in this embodiment, using for example, a 5-input OR gate 202. The output of OR gate 202 is then applied to the D input a final output register 204. Register 204 receives read clock RCK at its clock inputs.

Figure 4:
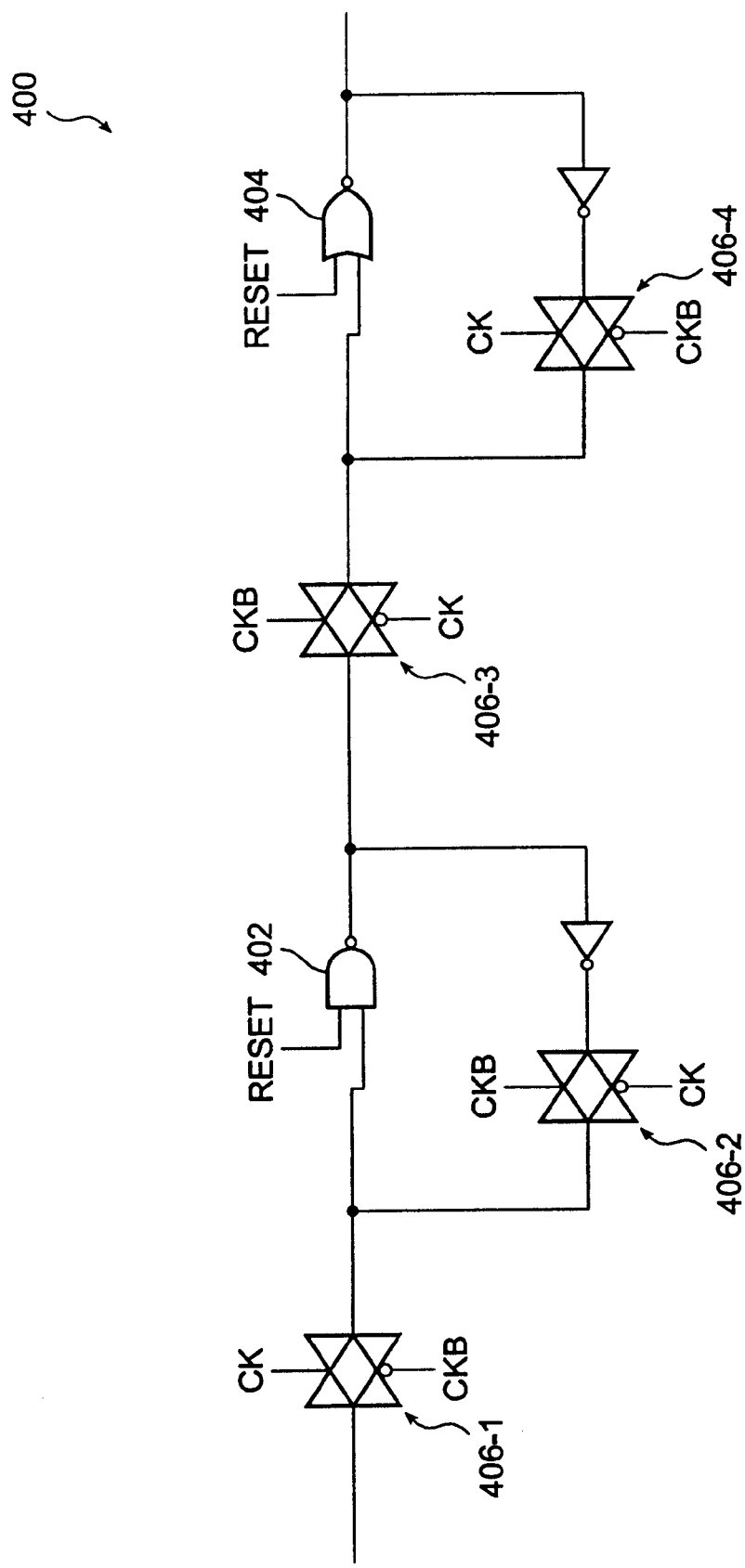
FIG. 4 shows a schematic diagram of an exemplary D-type flip-flop used in an overflow detection circuit, according to an embodiment of the present invention.

FIG. 4 shows a simplified high-level schematic diagram of an exemplary falling edge triggered D-type flip-flop 400 used in the overflow detection circuit according to the present invention. Flip-flop 400 includes a NAND gate 402 and a NOR gate 404 coupled to four transmission gates 406-1 to 406-4 in a master-slave structure as shown. A RESET input is provided at one input of NAND gate 402 and a RESETB input at one input of NOR gate 404. It is to be understood that this specific implementation as depicted and described herein for illustrative purposes only, and that alternative circuit implementations exist for the same functionality.

Figure 3:
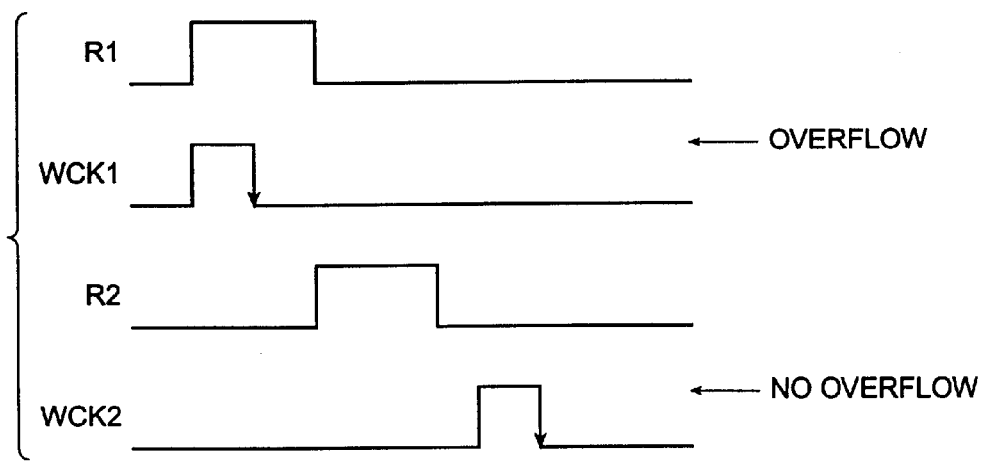
FIG. 3 shows a timing diagram illustrating the operation of the overflow detector of FIG. 2, according to an embodiment of the present invention.

In operation, the FIFO of the present invention detects overflow conditions by recording read pointers into registers using corresponding write pointers. In this particular embodiment, each register 200 receives one of the read clock pointer signals R1 to R5 at its D input. Also, each register 200 receives one of the write clock pointer signals WCk1 to WCk5 at its clock input. If at, for example, the falling edge of the corresponding write clock pointer signal, the read clock pointer signal is at a logical high, the register outputs a logical high signal signaling an overlap. This logical high signal thus indicates an overflow condition. The timing diagram is shown in FIG. 3 where register 200-1 signals an overflow condition (ER1=1) and register 200-2 does not (ER2=0). The Q output of each of the five flip flops 200, ER1 to ER5, can thus signal an overflow condition. OR gate 202 logically combines output signals ER1 to ER5 and applies the output to the D input of output register 204. The output register 204 is clocked by internal clock RCk and generates, at its output, the final overflow detect signal OVFB. An overflow condition at any one of the five registers causes signal OVFB to go low signaling a FIFO overflow.

According to the present invention, the duty cycle of the write pointer is made smaller than the duty cycle of the read pointer as shown in FIG. 3. In a specific embodiment the write clock duty cycle is half the read clock duty cycle. This can prevent the collision of two different write pointers. Also, this difference in the duty cycles ensures sufficient set-up and hold times when no overflow condition exists. For optimum matching of delays and set-up and hold times, overflow detection registers (200) preferably have an identical design as those of registers (102) used to read data out of the FIFO. Thus, if the falling edge of a write pointer cannot detect an overflow condition, the FIFO register (102) controlled by the same write pointer would not see an overflow condition because of matched set-up and hold times.

The overflow detector implementation according to this embodiment also addresses other conditions under which overflow may occur. For example, the write pointer may not toggle when, e.g., an external circuit feeding input data to the FIFO fails to feed input clock. If this occurs, the FIFO can not be updated with new data. Because the FIFO will still attempt to read data, an overflow condition would occur. According to the present invention, a clock present detector 206 monitors the write clock such that when it stops toggling, an overflow detection signal is asserted. A clock present detector can be implemented using various known circuit techniques. The output of clock present detector 206, which indicates the presence or lack of the write clock signal, is applied to the RESET input (and its inverse to the RESETB input) of output flip flop 204, and causes the output signal OVFB to go low (indicating overflow) when the write clock is not present.

In conclusion, it can be seen that the present invention provides numerous advantages. Principally, the overflow detector detects the collision of write pointers and read pointers, generates a flag to reset the FIFO and thus preserves data integrity. By implementing the overflow detector with a state machine as shown in FIG. 2, quick and accurate detection is ensured. By employing the clock present signal, the condition of external clock loss is also detected as overflow. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. For example, the FIFO can be of any depth having a larger or a smaller number of registers. The overflow detector would then have a corresponding number of registers. Alternative designs may be employed to implement the state machine shown in FIG. 2 using different types of registers and logic gates. The logic levels and logic circuitry may vary. For example, an AND gate can be used instead of OR gate 202 if the complementary outputs of flip flops 200 were used. Similarly, rising-edge triggered (instead of falling-edge triggered) flip flops can be employed with inverted logic. Therefore, the specific embodiment described is not intended to be exhaustive or to limit the invention, and the invention is intended to be accorded the widest scope consistent with the principles and novel features disclosed herein, and as defined by the following claims.

What is claimed is:

1. An overflow detector for an N-deep first-in-first-out (FIFO) circuit having a corresponding N pairs of read and write pointers, the overflow detector comprising:

N registers each receiving signals corresponding to a respective pair of read and write pointers from the N pairs of FIFO read and write pointers, each register having a data input coupled to receive a first signal corresponding to one of an associated read pointer or write pointer, a clock input coupled to receive a second signal corresponding to the other one of the associate read pointer or the write pointer, and an output; and logic circuit couple to receive all outputs of the N registers and configured to logically combine the outputs of the N register to generate an overflow signal.

2. The overflow detector of claim 1 wherein a duty cycle of the first signal is different than the duty cycle of the second signal.

3. The overflow detector of claim 2 wherein the duty cycle of the second signal is smaller than the duty cycle of the first signal.

4. The overflow detector of claim 3 wherein a duty cycle of the first signal is half the duty cycle of the second signal.

5. The overflow detector of claim 3 wherein the first signal corresponds to a read pointer and the second signal corresponds to a write pointer.

6. The overflow detector of claim 1 wherein the N-deep FIFO includes N registers, and wherein the N registers of the overflow detector have substantially identical structure as the N register of the FIFO.

7. The overflow detector of claim 1 further comprising a clock present detector coupled to the logic circuit and configured to generate the overflow signal when detecting loss of the second signal.

8. The overflow detector of 7 further comprising an output register having an input coupled to an output of the logic circuit and a clock input coupled to receive an internal clock signal.

9. The overflow detector of claim 8 wherein the output register has a control input coupled to an output of the clock present detector.

10. The overflow detector of claim 9 wherein the control input of the output register is one of reset or set input.

11. The overflow detector of claim 1 wherein each of the N registers is a D-type flip-flop, and wherein each register asserts a local overflow signal when its first signal is at a logical high at the falling edge of its corresponding second signal.

12. The overflow detector of claim 1 wherein each of the N registers is a D-type flip-flop, and wherein each register asserts a local overflow signal when its first signal is at a logical low at the rising edge of its corresponding second signal.

13. The overflow detector of claim 1 wherein the logic circuit is configured to perform an OR logic function.

14. A method for detecting overflow in a first-in-first-out (FIFO) structure having N register coupled to read pointers and corresponding write pointers, the method comprising:

for each register, detecting a logic state of a first signal representing one of the read pointer or its corresponding write pointer, using one edge of a second signal representing the other one of the read pointer or its corresponding write pointer as a sampling clock; and for any one of the N registers, if the detected logic state of the first signal is the same as the logic state of the second signal at the end of the transition of the one edge, signaling an overflow condition.

15. The method of claim 14 wherein a duty cycle of the first signal is different than a duty cycle of the second signal.

16. The method of claim 15 wherein the duty cycle of the second signal is less than the duty cycle of the first signal.

17. The method of claim 16 wherein the duty cycle of the second signal is one half the duty cycle of the first signal.

18. The method of claim 16 wherein the first signal corresponds to the read pointer and the second signal corresponds to the write pointer.

* * * * *